(12) United States Patent
Schulze et al.

(10) Patent No.: US 7,935,987 B2
(45) Date of Patent: May 3, 2011

(54) EPITAXIAL GROUP III NITRIDE LAYER ON (001)-ORIENTED GROUP IV SEMICONDUCTOR

(75) Inventors: Fabian Schulze, Magdeburg (DE); Armin Dadgar, Berlin (DE); Alois Krost, Berlin (DE)

(73) Assignee: AZZURO Semiconductors AG, Magdeburg (DE)

( * ) Notice: Subject to any disclaimer, the term of this patent is extended or adjusted under 35 U.S.C. 154(b) by 365 days.

(21) Appl. No.: 11/998,464

(22) Filed: Nov. 28, 2007

(65) Prior Publication Data

US 2008/0157123 A1  Jul. 3, 2008

Related U.S. Application Data

(60) Provisional application No. 60/861,672, filed on Nov. 28, 2006.

(51) Int. Cl.
*H01L 31/036* (2006.01)

(52) U.S. Cl. ........ 257/201; 257/190; 257/627; 257/628; 257/E29.104; 257/E31.049

(58) Field of Classification Search .................. None
See application file for complete search history.

(56) References Cited

U.S. PATENT DOCUMENTS

2005/0277260 A1  12/2005  Cohen et al. ............. 438/387

OTHER PUBLICATIONS

Grundmann, M. et al., "Low-temperature metalorganic chemical vapor deposition of InP on Si(001)", Appl. Phys. Lett. 58 (3), Jan. 21, 1991, pp. 284-286.
Alerhand, O.L. et al., "Finite-Temperature Phase Diagram of Vicinal Si(100) Surfaces", Physical Review Letters, vol. 64, No. 20 (May 14, 1990): pp. 2406-2409.
Cao, J. et al., "Improved quality GaN by growth on compliant silicon-on-insulator substrates using metalorganic chemical vapor deposition", Journal of Applied Physics, vol. 83, No. 7 (Apr. 1, 1998): pp. 3829-3834.
Dabrowski, J. et al., "Self-consistent study of the electronic and structural properties of the clean Si(001)(2 X 1) surface", Applied Surface Science 56-58 (1992): pp. 15-19.
Joblot, S. et al., "Growth of wurtzite-GaN on silicon (100) substrate by molecular beam epitaxy", Phys. Stat. Sol. (c) 2, No. 7 (2005): pp. 2187-2190.

(Continued)

*Primary Examiner* — Minh-Loan T Tran
*Assistant Examiner* — Fei Fei Yeung Lopez
(74) *Attorney, Agent, or Firm* — Ware, Fressola, Van Der Sluys & Adolphson LLP

(57) ABSTRACT

Group III nitride layers have a wide range of uses in electronics and optoelectronics. Such layers are generally grown on substrates such as sapphire, SiC and recently Si(111). For the purpose inter alia of integration with Si-CMOS electronics, growth on Si(001) is indicated, which is possible only with difficulty because of the different symmetries and is currently limited solely to misoriented Si(001) substrates, which restricts the range of use. In addition, the layer quality is not at present equal to that produced on Si(111) material. Growth on exactly oriented Si(001) and an improvement in material quality can now be simply achieved by a modification of the surface structure possible with a plurality of methods.

14 Claims, 4 Drawing Sheets

OTHER PUBLICATIONS

Krost, A. et al., "GaN-based epitaxy on silicon: stress measurements", Phys. Stat. Sol. (a) 200, No. 1 (2003): pp. 26-35.

Lebedev, V. et al., "Hexagonal AlN films grown on nominal and off-axis Si(001) substrates", Journal of Crystal Growth 230 (2001): pp. 426-431.

Osten, H.J. et al., "Local structure of strain-compensated epitaxial $Si^{1-x-y}Ge^{x}C^{y}$ layers on Si(001) grown with molecular beam epitaxy", Journal of Crystal Growth 150 (1995): pp. 931-933.

Schulze, F. et al., "Metalorganic vapor phase epitaxy grown InGaN/GaN light-emitting diodes on Si(001) substrate", Applied Physics Letters 88, 121114 (2006): pp. 121114-1-1121114-3.

Schulze, F. et al., "Growth of single-domain GaN layers on Si(001) by metalorganic vapor-phase epitaxy", Journal of Crystal Growth 289 (2006): pp. 485-488.

Swartzentruber, B.S. et al., "Observations of strain effects on the Si(001) surface using scanning tunneling microscopy[a]", J. Vac. Sci. Technol. A 8 (1), Jan./Feb. 1990, pp. 210-213.

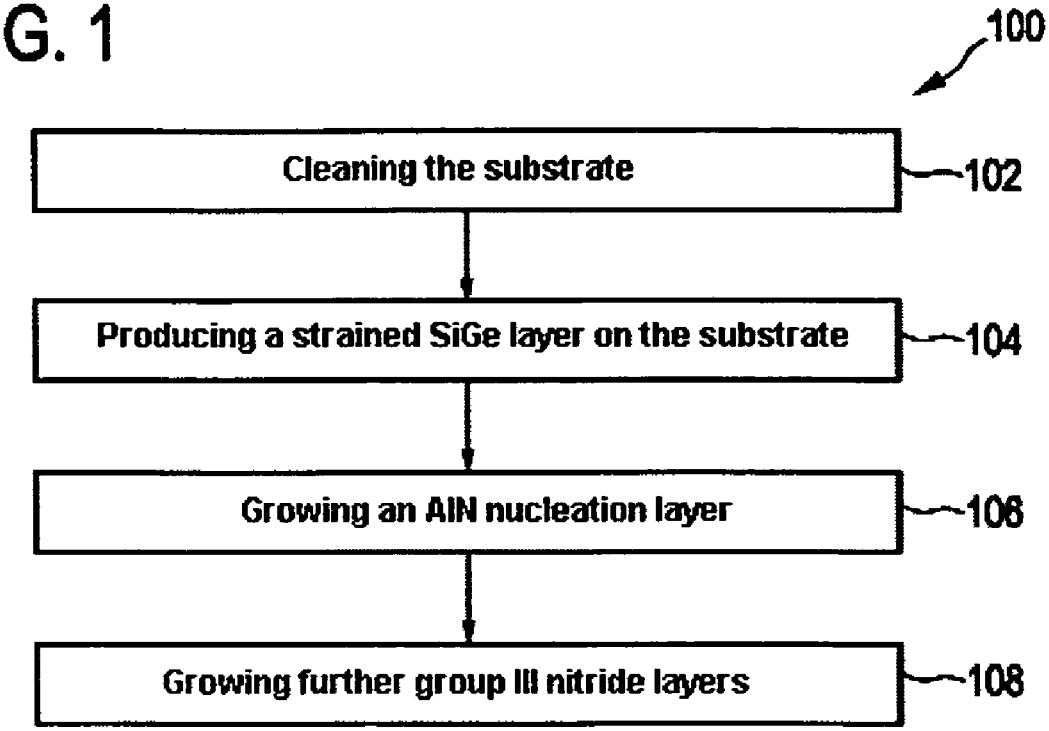
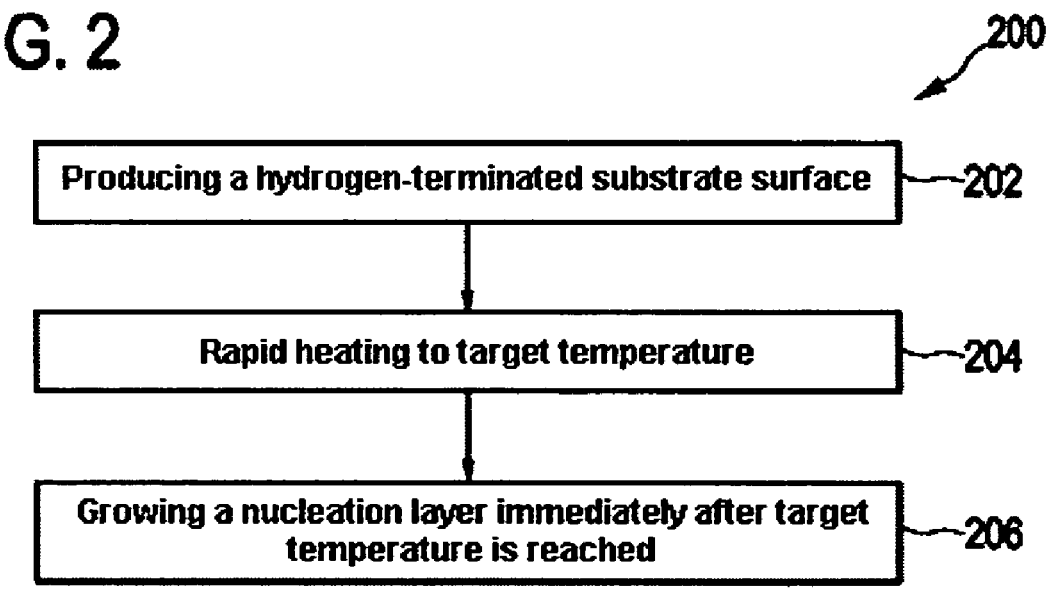

EPITAXIAL GROUP III NITRIDE LAYER ON (001)-ORIENTED GROUP IV SEMICONDUCTOR

CROSS REFERENCE TO RELATED APPLICATION

Reference is made to and priority claimed from U.S. provisional application Ser. No. 60/861,672, filed Nov. 28, 2006, entitled Epitaxial group III nitride layer on (001)-oriented group IV semiconductor.

BACKGROUND OF THE INVENTION

1. Technical Field

The invention relates to a multilayer structure with an epitaxial group III nitride layer on either a (001) surface of a group IV semiconductor or a surface of the group IV semiconductor which has a misorientation of less than 8 degrees relative to a (001) orientation. The invention further relates to a semiconductor component with such a multilayer structure and to use of a substrate with either a (001) surface of a group IV semiconductor or a surface of the group IV semiconductor which has a misorientation of less than 8 degrees relative to a (001) orientation to produce at least one epitaxial group III nitride layer thereon. Finally, the invention relates to a method of producing a multilayer structure with an epitaxial group III nitride layer and to a method of producing a semiconductor component with such a multilayer structure.

2. Discussion of Related Art

Group III nitride layers on Si(111) surfaces offer a significant cost saving with regard to substrate costs over growth on sapphire and SiC and the possibility of scaling to the diameters conventional in the silicon industry (currently diameters of up to 300 mm), which lowers processing costs further.

This also makes possible, inter alia, integration of III-V semiconductors with silicon technology. For this, however, growth on Si(001) is preferable, this being the standard surface for current Si CMOS technology.

Growth of the hexadic group III nitrides on four-fold Si(001) is difficult, however, due to the unmatched symmetry. It is currently successful only on substrates with a misorientation of above approximately 3°, the material quality being poorer than on Si(111) [Joblot, Schulze1, Schulze2].

The exact cause of the successful growth of monocrystalline GaN on misoriented Si(001) is as yet unknown. It is assumed that there is a possible correlation between the orientation of AlN crystallites and the atomic arrangement of the silicon sub-lattice on the substrate surface [Lebedev]. AlN is often used as the nucleation layer prior to growth of the GaN main layer.

The invention is described below firstly with regard to its method aspect.

DISCLOSURE OF INVENTION

According to a first aspect of the invention, a method is provided for producing a multilayer structure with an epitaxial group III nitride layer. The method has the steps of:
providing a substrate with either a (001) surface of a group IV semiconductor or a surface of the group IV semiconductor which has a misorientation of less than 8 degrees relative to a (001) orientation, the surface of the group IV semiconductor having a surface reconstruction in which atoms of the group IV semiconductor are arranged in two mutually perpendicular crystallographic directions parallel to the surface at different distances from one another,
depositing a group III nitride layer on the substrate.

The method enables the deposition of a high quality epitaxial group III nitride layer on a (001) surface of a group IV semiconductor. (001) faces and surfaces of the group IV semiconductor, which have a misorientation of less than 8 degrees relative to a (001) orientation, are used as standard in the industrial production of semiconductor components.

An extremely important example of a (001) surface of a group IV semiconductor is Si(001). Here, in an exemplary embodiment, the method enables the growth of an epitaxial group III nitride layer on Si(001) with relatively small misorientations and thus the growth of epitaxial group III nitride layers on the industrially customary standard material used in integrated semiconductor electronics.

Furthermore, in one exemplary embodiment of the method according to the invention, it is possible to achieve a higher crystal quality for epitaxial group III nitride layers on misoriented (vicinal) Si(001). However, the method is also suitable for Ge surfaces, SiGe surfaces, SiGeC surfaces or other group IV surfaces.

Exemplary embodiments of the method according to the invention are described below. The examples may be combined, so long as the description thereof does not reveal anything contradictory.

In an exemplary embodiment, the step of providing the substrate comprises the provision of a substrate with group IV dimer chains, oriented along a first one of the two perpendicular crystallographic directions, on the surface of the group IV semiconductor.

In this exemplary embodiment, a surface reconstruction with dimers along a preferred direction is achieved, and thus a surface symmetry break which allows monocrystalline group III nitride growth.

Group IV dimers contain individual bonds between two group IV atoms. Taking the example of a silicon substrate with a silicon surface, the group IV dimer has the form Si—Si. Group IV dimer chains form strings of dimers in one direction, each dimer not being bonded directly to the neighboring dimer. In preferred exemplary embodiments, the dimer chains are oriented along the <110> directions. In the case of zincblende crystal, the chains are oriented, depending on the uppermost atomic layer, in a (1×2) direction or in a direction rotated by 90° relative thereto. The first orientation corresponds to a 1×2 reconstruction and the second orientation to a 2×1 reconstruction. Which of the two reconstructions occurs is adjustable, for example by means of the strain, since tension and pressure in each case favor one or other reconstruction.

In a further exemplary embodiment, the step of providing the substrate comprises depositing a group IV semiconductor layer of the type $Si_{1-x-y}Ge_xC_y$, with $x+y<1$ and a strain relative to the group IV semiconductor substrate of an amount greater than 0.02%, on a group IV semiconductor substrate. By pre-tensioning the substrate surface by means of strained layers, it is possible, for example, depending on the strain sign, to select one of the two possible orientations of the group III nitride on the surface, which offers advantages in the case of laterally emitting optoelectronic components and also in the case of singulation of components due to the different choice of possible preferential break direction.

Another possible way of imparting strain and thus surface reconstruction is the production of strained layers in the case of SOI or SIMOX wafers. In a further exemplary embodiment, the step of providing a substrate accordingly includes the provision either of an SOI substrate or an SIMOX substrate, the silicon layer of which forms a strained (001) surface layer. In this case, the Si(001) surface layer may be strained during the wafer production process, e.g. by temperature gradients during production or, in the case of oxide layers created by implantation, by the implantation process and expansion of the silicon oxide with at the same time the smallest possible thickness of Si(001) remaining on the surface.

In another exemplary embodiment, the step of providing a substrate includes a step of producing a surface of the group IV semiconductor with stripe-shaped trench structures or ridge structures in a <110> direction consisting of a small number of $Si_{1-x-y}Ge_xC_y$ atomic layers. This method typically produces double steps, or a preferred surface orientation through the etching of trenches or the application of layers of $Si_{1-x-y}Ge_xC_y$ just a few monolayers thick. This produces either double steps on these stripe-shaped structures, i.e. a corrugated surface, or these stripes, which may also be interrupted, assume a preferred orientation as surface reconstruction unfolds. They thus form the basis for subsequent monocrystalline growth of a group III nitride layer.

Additional strain, brought about for example by alloying Si with Ge or C, further improves orientation selection and reduces the twist of the grown group III nitride layer.

In continuation of this variant, the possibility arises of producing wider trenches or ridges. These lead, presumably due to anisotropic strain during growth, to monocrystalline growth over a larger area. Therefore, the dimensions of the structures may be selected to be relatively large in the micrometer range with this method, wherein the structure depth or height has to lie in the range >>10 nm, preferably >100 nm, in order to be able to produce an anisotropic strain component.

Artificial steps may also be produced on the surface using lithography, these amounting to a misoriented surface, so likewise forcing surface reconstruction with dimer rows in one direction.

If no strained layer is desired on the surface, rapid heating may bring about substrate curvature or strain due to considerable thermally induced strain between the bottom and top of the substrate. In one exemplary embodiment, therefore, the step of providing a substrate therefore involves a step of straining the substrate by rapid heating to a target temperature for nucleation layer growth of a group III nitride nucleation layer.

The method of this exemplary embodiment may be performed in common MBE or MOVPE reactors. Thus, in a first alternative embodiment, straining of the substrate may be performed in a cold wall reactor using a CVD process with a target temperature $T_z$ of around 900-1400° C. with a rate of temperature increase of more than 5 K s$^{-1}$ at least in a temperature range of from $T_z$-100 K to $T_z$-30 K. In a second alternative embodiment, straining of the substrate is performed under a high vacuum or with an MBE process with a target temperature $T_z$ of around 500-900° C. with a rate of temperature increase of more than 5 K s$^{-1}$ at least in a temperature range of from $T_z$-100 K to $T_z$-30 K.

In one exemplary embodiment, the target temperature amounts to 1100° C., and temperature increases of 10 K/s are preferably used. In this way, a steep temperature gradient is obtained, which is also supported by the limited heat conductivity of the Si substrate. Such a temperature gradient leads throughout the Si crystal to strains and as a rule to severe tensile strain at the surface. This leads in turn, even in the case of exactly oriented substrates, to uniform surface reconstruction, which enables monocrystalline growth of group III nitrides.

According to a second aspect of the invention, a method is provided for producing a semiconductor component which contains a multilayer structure with an epitaxial group III nitride layer. The method comprises the step of:
producing a multilayer structure with an epitaxial group III nitride layer using a method according to the first aspect of the invention or to one of the exemplary embodiments thereof.

On the basis of the procedure according to the invention, it is possible, in particular when using one or more of the above-described exemplary embodiments, to produce high-grade group III nitride components on Si(001). Such components, such as light emitters, in particular lasers, may be grown in such a way that the preferential break directions of the facets of the group III nitride layer, for example in the form of GaN or a per se known multilayer structure for a laser diode, and of the Si substrate coincide. This is a significant advantage for edge emitters, since dry and wet chemical etching of the side facets, which is complex and generally not very satisfactory, may be dispensed with.

In the case of transistor components which may be operated at markedly higher frequencies, powers or voltages than Si or SiGe transistors, integration with Si control electronics is feasible, preferably on the back of the substrate after growth of the group III nitride component.

A third aspect of the invention takes the form of use of a substrate with either a (001) surface of a group IV semiconductor or a surface of the group IV semiconductor which has a misorientation of less than 8 degrees relative to a (001) orientation to produce at least one epitaxial group III nitride layer thereon, the surface of the group IV semiconductor having a surface reconstruction in which atoms of the group IV semiconductor are arranged in two mutually perpendicular crystallographic directions parallel to the surface at different distances from one another.

Advantages and exemplary embodiments of the use according to the invention correspond to those of the method constituting the first aspect.

A fourth aspect of the invention involves a multilayer structure with an epitaxial group III nitride layer on either a (001) surface of a group IV semiconductor or a surface of the group IV semiconductor which has a misorientation of less than 8 degrees relative to a (001) orientation, the group III nitride layer being deposited on the surface of the group IV semiconductor with a surface reconstruction in which atoms of the group IV semiconductor are arranged in two mutually perpendicular crystallographic directions parallel to the surface at different distances from one another.

The multilayer structure of the fourth aspect of the invention is the result of the procedure constituting the method according to the first aspect of the invention.

Exemplary embodiments of the multilayer structure according to the invention are described below.

One exemplary embodiment comprises a multilayer structure in which group IV dimer chains oriented along a first one of the two perpendicular crystallographic directions are arranged on the surface of the group IV semiconductor.

A further exemplary embodiment comprises a multilayer structure in which a group IV semiconductor layer of the type $Si_{1-x-y}Ge_xC_y$, with x+y<1 and a strain relative to the group IV semiconductor substrate of an amount greater than 0.02%, is arranged between a group IV semiconductor substrate and the epitaxial group III nitride layer.

A further exemplary embodiment involves a multilayer structure with either an SOI substrate or an SIMOX substrate, the silicon layer of which forms a strained (001) surface layer.

Another exemplary embodiment involves a multilayer structure in which the surface of the group IV semiconductor comprises stripe-shaped trench structures or ridge structures in a <110> direction consisting of a small number of $Si_{1-x-y}Ge_xC_y$ atomic layers.

A further exemplary embodiment comprises a multilayer structure in which the trenches extend by between 500 nm and 1 mm in one of the two crystallographic directions parallel to the surface and have a periodicity of between 500 nm and 2 mm.

According to a fifth aspect of the invention, a multilayer structure with an epitaxial group III nitride layer is provided on either a (001) surface of a group IV semiconductor or a surface of the group IV semiconductor which has a misorientation of less than 8 degrees relative to a (001) orientation,
- an epitaxial group III nitride layer being deposited on the surface of the group IV semiconductor, which epitaxial group III nitride layer comprises crystallites of a first and a second type with in each case different interatomic distances in each case two mutually perpendicular crystallographic directions parallel to the surface,
- the crystallites of the two types differing from one another in that the in each case smaller interatomic distance occurs in mutually perpendicular crystallographic directions relative to the surface of the group IV semiconductor, and
- the crystallites of a first one of the two types occurring in the group III nitride layer only up to a certain distance from the surface of the group IV semiconductor, and there with a lesser frequency than the crystallites of the second type.

Exemplary embodiments of the multilayer structure according to the invention in accordance with the fifth aspect of the invention are described below.

One exemplary embodiment has a multilayer structure in which a group IV semiconductor layer of the type $Si_{1-x-y}Ge_xC_y$, with x+y<1 and a strain relative to the group IV semiconductor substrate of an amount greater than 0.02%, is arranged between a group IV semiconductor substrate and the epitaxial group III nitride layer.

Another exemplary embodiment involves a multilayer structure with either an SOI substrate or an SIMOX substrate, the silicon layer of which forms a strained (001) surface layer.

A further exemplary embodiment involves a multilayer structure in which the surface of the group IV semiconductor comprises stripe-shaped trench structures or ridge structures oriented in a <110> direction and consisting of a small number of $Si_{1-x-y}Ge_xC_y$ atomic layers.

Another exemplary embodiment comprises a multilayer structure in which the trenches extend by between 500 nm and 1 mm in one of the two crystallographic directions parallel to the surface and have a periodicity of between 500 nm and 2 mm.

According to a sixth aspect of the invention, a semiconductor component is provided which contains a multilayer structure according to the fourth or fifth aspect of the invention or one of the exemplary embodiments thereof.

In a preferred exemplary embodiment, the semiconductor component contains, in an integrated circuit, at least one first component with a multilayer structure according to one of the stated previous two aspects of the invention. It additionally contains at least one second component, which does not contain a group III nitride layer.

A further aspect of the invention is constituted by a substrate with either a (001) surface of a group IV semiconductor or a surface of the group IV semiconductor which has a misorientation of less than 8 degrees relative to a (001) orientation, the surface of the group IV semiconductor having a surface reconstruction in which atoms of the group IV semiconductor are arranged in two mutually perpendicular crystallographic directions parallel to the surface at different distances from one another, and the surface of the group IV semiconductor having stripe-shaped trench structures or ridge structures oriented in a <110> direction and consisting of a small number of $Si_{1-x-y}Ge_xC_y$ atomic layers.

The substrate according to the invention enables the growth of epitaxial group III nitride layers in conjunction with the above-described embodiments of the procedure according to the invention.

In one exemplary embodiment of the substrate according to the invention, trenches extend by between 500 nm and 1 mm in one of the two crystallographic directions parallel to the surface and have a periodicity of between 500 nm and 2 mm.

In one exemplary embodiment of the substrate according to the invention, the lateral spacing of the stripe-shaped trench or ridge structures from one another amounts to between 40 and 60 nm.

In one exemplary embodiment of the substrate according to the invention, the stripe-shaped trench or ridge structures have a depth or height respectively of between 0.5 and 5 nm relative to the surface of the group IV semiconductor.

In one exemplary embodiment of the substrate according to the invention, the stripe-shaped trench or ridge structures extend laterally respectively by between 0.5 and 10 nm.

BRIEF DESCRIPTION OF THE DRAWINGS

A description follows of further exemplary embodiments of the various aspects of the invention made with reference to the Figures.

FIG. 1 is a flow chart of a first exemplary embodiment of a method of producing an epitaxial group III nitride layer on an Si(001) surface;

FIG. 2 is a flow chart of a second exemplary embodiment of a method of producing an epitaxial group III nitride layer on an Si(001) surface;

DETAILED DESCRIPTION

The growth of strained layers in the system of group IV elements (in particular Si, Ge, C) is most readily possible with SiGe on Si. FIG. 1 shows a flow chart of an exemplary embodiment of a method 100 for producing an epitaxial group III nitride layer on an Si(001) surface.

Such a process is started, if it is to take place in the same growth chamber as for group III nitride growth, by firstly cleaning an Si(001) substrate at temperatures of over 1000° C. in a hydrogen atmosphere (step 102). Alternatively, wet chemical cleaning may be carried out beforehand, as described in [Grundmann] for example.

Then a strained SiGe layer is produced at temperatures preferably of around 1000° C.-1400° C., by growing a thin layer on an Si substrate with the gases present in part as dopants, such as for example $SiH_4$ or $GeH_4$ or indeed other gaseous or organometallic compounds of these starting materials (step 104). Sufficient for this purpose is a layer thickness of a few monolayers which should not be relaxed, i.e. should remain below the critical layer thickness for relaxation.

After growth of this layer, the growth takes place at preferably 1050° C.-1200° C. of an AlN nucleation layer (step 106), which is ideally started by first-time opening of the aluminum supply, i.e. for example of a trimethylaluminum flow. After a period of 5-20 s, for example ammonia or another nitrogen precursor is then added and approx. 20-200 nm thick AlN is grown.

Further group III nitride layers may then be grown thereon (step 108).

A second possibility for temperature-induced strain is based on the finite thermal conductivity of the substrate and maintenance of a cold upper side in a cold wall reactor. FIG. 2 is a flow chart of a corresponding second exemplary embodiment of a method 200 for producing an epitaxial group III nitride layer on an Si(001) surface.

Here, the substrate, which has ideally been previously hydrogen-terminated, this being effected for example by wet chemical preparation (step 200), is heated at least in the range below 100° C. rapidly to the target temperature. The important factor here is the previous preparation of the surface, since nucleation layer growth must start immediately after the target temperature has been reached. Too long a period of temperature stabilization in the range of several minutes, as is often the case, results in the strain being reduced and in the desired effect being lost.

Figure 3:
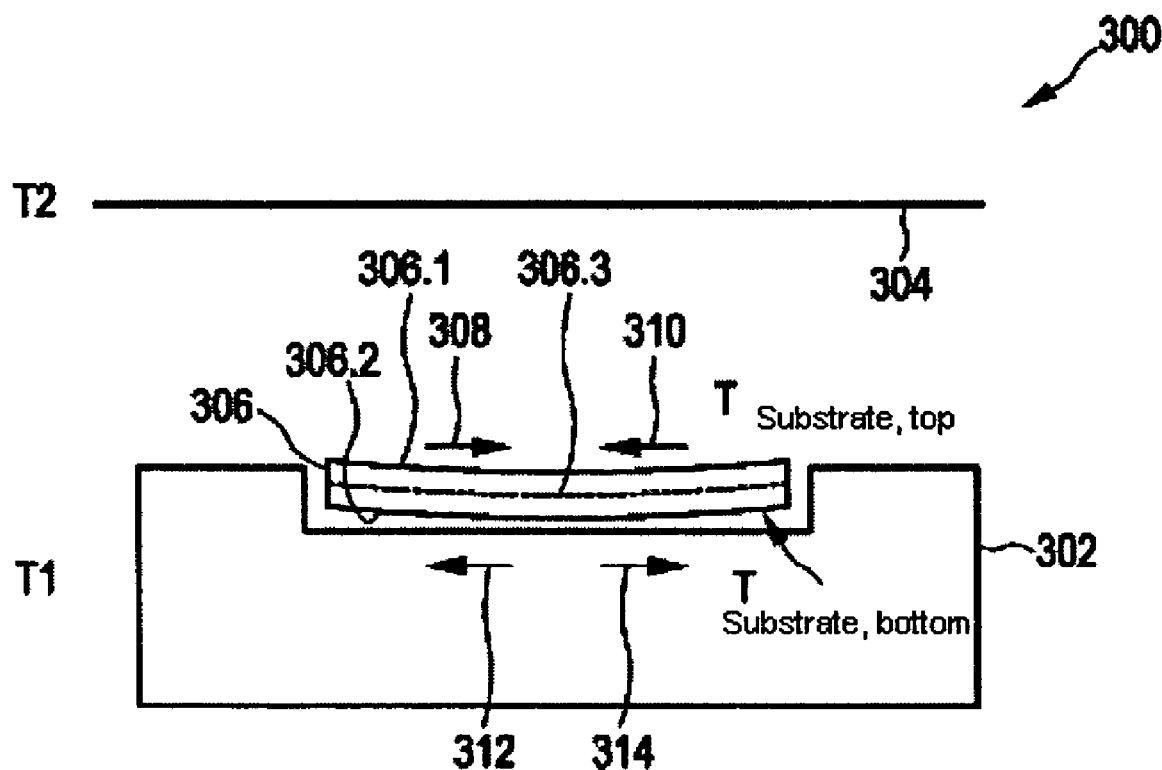
FIG. 3 shows, to illustrate the method of FIG. 2 in greater detail, a schematic representation of a reactor arrangement with a susceptor and a substrate mounted therein.

In FIG. 3 the effect is illustrated schematically using a reactor arrangement 300. A susceptor 302 has a susceptor temperature T1, which is usually several hundred degrees above the temperature T2 of a surrounding reactor wall. The reactor wall is shown schematically with reference numeral 304. The temperature gradient established, which is steeper if rapid temperature increases are used, leads to curvature of a substrate 306 mounted in the susceptor 302, since an upper side 306.1 of the substrate 306 is colder than an underside 306.2 and is therefore subject to tensile strain, as symbolized by two arrows 308 and 310 pointing towards one another. The substrate underside 306.2, on the other hand, is subject to compressive strain, which is symbolized by two arrows 312 and 314 pointing away from one another. Generally, the substrate 306 is not under strain in the middle, shown symbolically in FIG. 3 by a dotted line 306.3.

As a third possibility, in the case of an SOI or SIMOX substrate, the upper layer is pretensioned, in that it is either held during bonding for as long as possible at a higher or lower temperature than the other layer or the damage arising as a result of the implantation process also causes strain close to the surface, which strain can no longer be completely reduced by heating.

Enrichment of the upper layer with oxygen or nitrogen by means of implantation likewise leads to strain. In this respect, perfection of the silicon surface is of secondary importance, as long as a crystalline surface is present which displays the usual reconstruction such as for example (1×2) at high temperatures.

Figure 4:
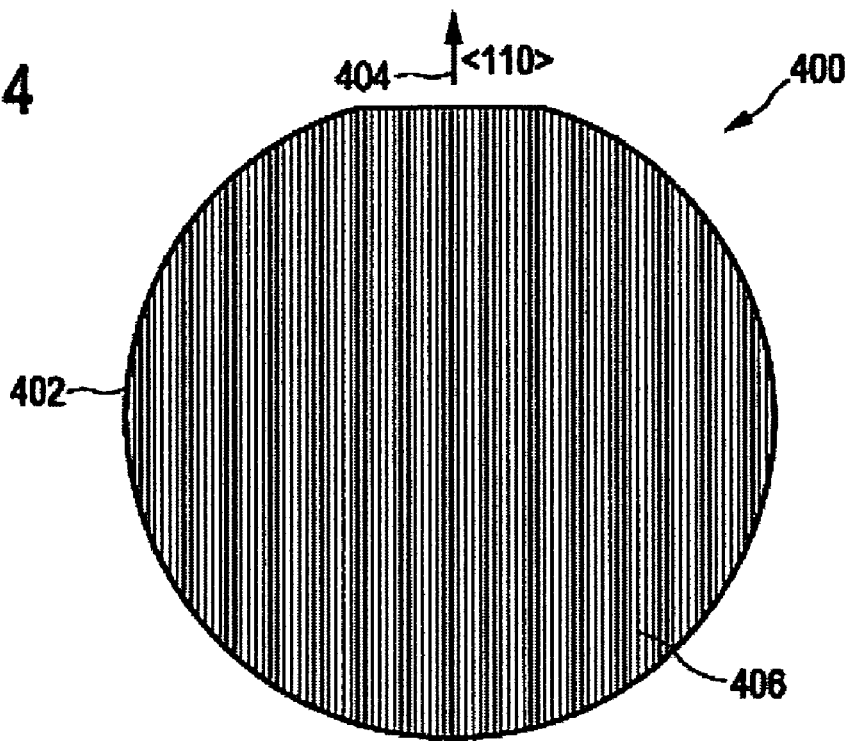
FIG. 4 shows a plan view of a wafer according to the invention.

As a fourth possibility for achieving crystalline orientation, it is possible to provide the surface, in a <110> direction, with trenches by etching or with ridges by applying material from the SiGeC system. This is shown schematically in FIGS. 4 to 6. FIG. 4 shows a plan view of a structured Si wafer 400. The plan view shows a (001) surface 402. Line- or (upon examination under higher magnification) stripe-shaped structures, for example a structure 406, are produced on the (001) surface 402 in a crystallographic direction <110> indicated by an arrow 404. The direction <110> points, in the substrate surface 402 which corresponds in the illustration of FIG. 4 with the plane of the paper, in the direction of the upper edge of the page. The line-shaped structures may be ridges or trenches, depending on the embodiment. This is explained below with reference to cross-sectional views of the wafer 400 shown in FIGS. 5 and 6.

Figure 5:
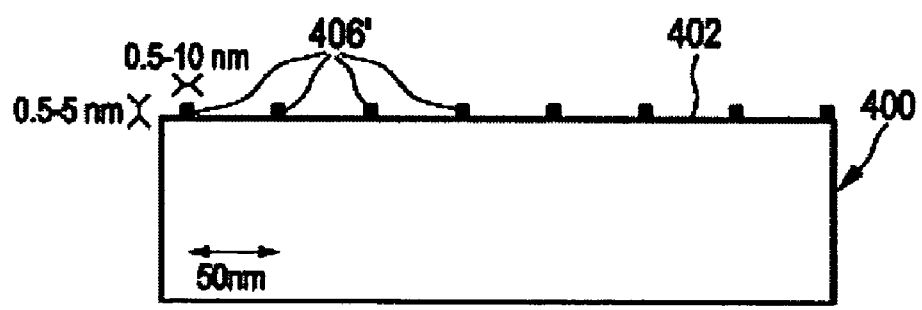
FIGS. 5 and 6 show cross-sectional views of alternative embodiments of the wafer of FIG. 4.
Figure 6:
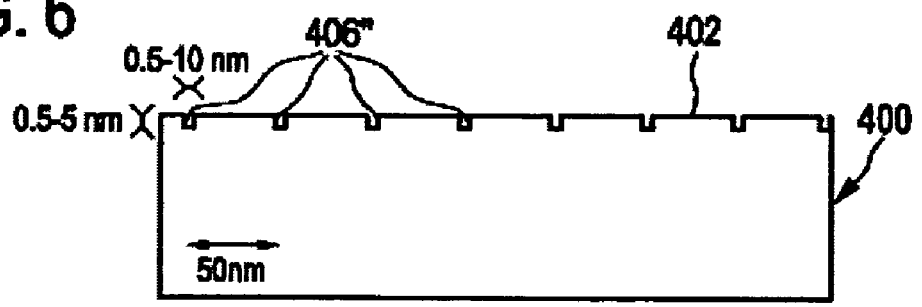

In a first embodiment (FIG. 5), the wafer 400 has line-shaped structures in the form of ridges 406', which take the form of raised additions of material from the SiGeC system. However, it is also possible to etch ridges, i.e. to etch material out from between the future ridges. The preferred dimensions are indicated in FIG. 5 and are preferably between 0.5 and 5 nm as regards height, i.e. greater than 2 monolayers, and between 0.5 and 10 nm as regards width.

In a second embodiment (FIG. 6), the wafer 400 has line-shaped structures in the form of etched trenches 406". The preferred dimensions are indicated and, in particularly favorable embodiments, are between 0.5 and 5 nm as regards depth, i.e. greater than 2 monolayers, and between 0.5 and 10 nm as regards width.

The lateral spacing of these line-shaped structures 406' or 406" should ideally be in the range of around 50 nm, which may best be achieved lithographically by imprint technology or holographic interferometry with UV light. The structures achieved do not have to be continuous lines, but rather may also be interrupted. The structuring requirements are thus not very high. Small defects can be tolerated. As a result of this applied structure, artificial steps are formed during the growth of group III nitride layers even without misorientation of the substrate, which steps induce uniform surface reconstruction and thus enable monocrystalline group III nitride growth.

A method which at first glance is similar to this is the etching of larger structures, which is stated as a fifth method under point. The structuring here induces anisotropic strain of the surface layer in the system at high temperatures, which allows stress-induced surface reconstruction just as with the other, above-described methods and thus monocrystalline growth. Thus, the mode of operation is different here from under point in the exemplary embodiment described immediately above, and the orientation of the trenches also does not play an important role in the success of the method.

Combination of the group III nitride component and Si component or passive elements such as $SiO_2$ waveguides is best effected if the high temperature steps, i.e. the group III nitride growth, take place first. Removal of the silicon nitride layer which has formed on the areas without growth, e.g. by etching with HF, is followed by production of the Si components. However, it is also possible firstly to perform high temperature Si process steps and to protect the areas used therefore, preferably on the back of the substrate, e.g. by an applied SiN or $SiO_2$ layer during group III epitaxy.

In this way, high power and high frequency transistors, light emitters and group III nitride-based sensor surfaces as well as MEMS may be simply integrated with the existing Si technology.

The invention relates to all group III nitrides on Si substrates with (001) surfaces, these possibly also having a misorientation of several degrees, conveniently of up to around 8°, and (001) being the general way of writing said {001} surfaces, as (100), (010), (001) etc. Moreover, it relates to all epitaxial production processes which are suitable for producing group III nitride layers. At the same time, the growth temperatures and V/III ratios have frequently to be adapted to the process conditions. For instance, the growth temperatures in the MBE process are always a few hundred degrees below those of the MOVPE process. All suitable precursors, in addition to those stated herein, may also be used to produce the layers.

Figure 8:
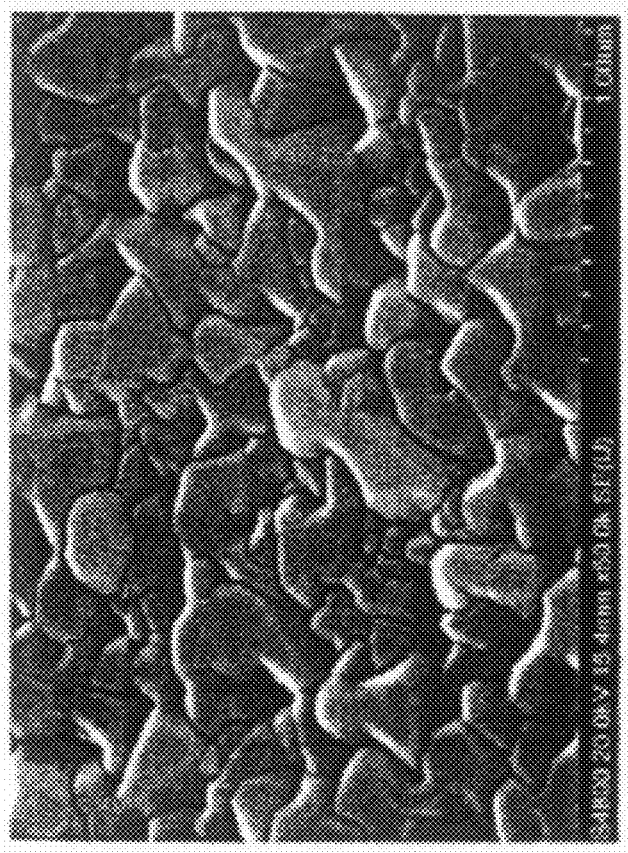
FIG. 8 shows a scanning electron micrograph of an epitaxial GaN layer 100 nm thick grown on an AlGaN buffer layer according to FIG. 7 and a (001) Si surface.
Figure 7:
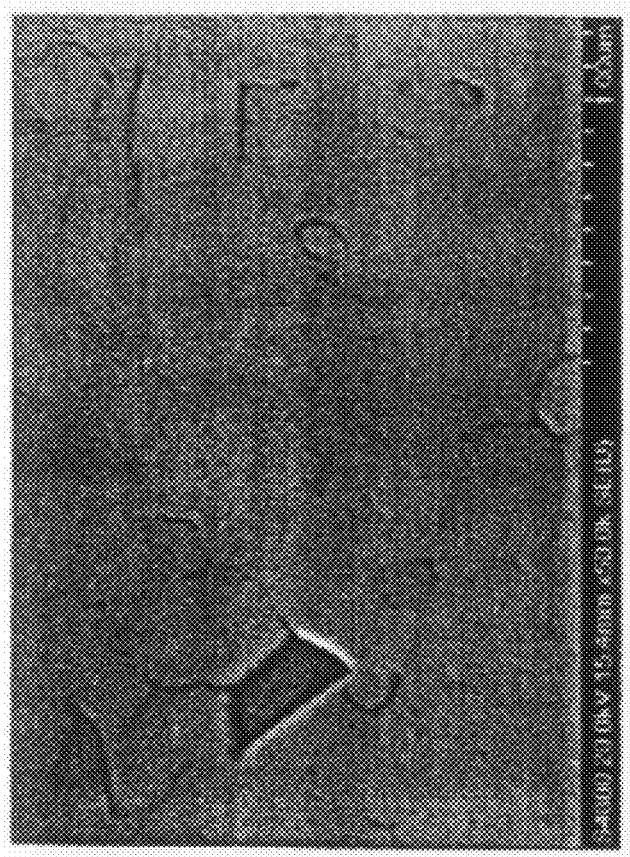
FIG. 7 shows a scanning electron micrograph of an AlGaN buffer layer on a (001) Si surface

FIG. 7 shows a scanning electron micrograph of an AlGaN buffer layer on a (001) Si surface. FIG. 8 shows a scanning electron micrograph of an epitaxial GaN layer 100 nm thick grown on an AlGaN buffer layer corresponding to FIG. 7 and a (001) Si surface. Reference will be made below to both Figures in parallel.

In FIG. 7, crystallites of the buffer layer are made visible by means of FE-SEM imaging, these forming sharp boundaries which may be clearly detected as dark lines. This micrograph, which has been taken at an accelerating voltage of 20 kV and with a magnification of 50,000 (c.f. markings at lower right-hand edge of image), is typical of growth both on exactly oriented Si(001) substrate and on misoriented material, where the selection of a crystallite orientation is promoted by the procedure according to the invention and the material is subject to less twist of the crystallites oriented in one direction.

During growth of a III-V layer growing first (lower buffer layer), crystallites arise with two orientations. For example, crystallites of a first orientation grow on Si surface portions with a 1×2 reconstruction, while crystallites of the second orientation grow on Si surface portions with a 2×1 reconstruction. As a result of the preselection provided by the method according to the invention, which is brought about in that one of the two reconstructions on the Si surface is produced purposefully in a higher proportion, crystallites of the lower buffer layer arise with greater frequency with the preselected orientation. This more frequent orientation also propagates laterally during growth, because a small number of interfaces between crystallites is favorable with regard to energy. Crystallites of the non-preferred orientation may be recognized in FIG. 7 due to their smaller height in comparison to crystallites of the preferred orientation. The precise orientation of the respective crystallites is not clear from the micrograph. In some samples very slight tilting of the crystallites relative to one another is also observed.

During further growth, the growth of crystallites of preferred orientation therefore dominates and overgrows the crystallites of the unfavored orientation. The result of such further growth is visible in FIG. 8, in which approximately 100 nm of GaN was additionally grown on an AlGaN buffer as in FIG. 7. The high crystalline quality of this epitaxial group III nitride layer grown on Si(001) is revealed inter alia in a particularly smooth, very largely closed surface.

The following references are mentioned in the above description and are incorporated by this reference fully into the disclosure of the present description:

[Joblot] S. Joblot, F. Semond, F. Natali, P. Vennéguès, M. Laügt, Y. Cordier, and J. Massies, Phys. Stat. Sol. (c) 2, 2187 (2005)

[Schulze1] F. Schulze, A. Dadgar, J. Bläsing, T. Hempel, A. Diez, J. Christen, and A. Krost, Journal of Crystal Growth 289, 485 (2006);

[Schulze2] F. Schulze, A. Dadgar, J. Bläsing, A. Diez, and A. Krost, Applied Physics Letters 88, 121114 (2006)

[Lebedev] V. Lebedev, J. Jinschek, K. Kräuβlich, U. Kaiser, B. Schröter, W. Richter, J. Cryst. Growth 230, 426 (2001)

[Schwarzentruber] Swartzentruber, Y. W. Mo, M. B. Webb and M. G. Lagally, J. Vac. Sci. Technol. A8(1), 210, (1990)

[Grundmann] M. Grundmann, A. Krost and D. Bimberg, Appl. Phys. Lett. 58, 284 (1991)

What is claimed is:

1. A multilayer structure with an epitaxial group III nitride layer on either a (001) surface of a group IV semiconductor or a surface of the group IV semiconductor which has a misorientation of less than 8 degrees relative to a (001) orientation, the group III nitride layer being deposited on the surface of the group IV semiconductor with a surface reconstruction in which surface atoms of the group IV semiconductor are arranged in two mutually perpendicular crystallographic directions parallel to the surface at different distances from one another, and in which a group IV semiconductor layer of the type $Si_{1-x-y}Ge_xC_y$, with x+y<1 and a strain relative to the group IV semiconductor substrate of an amount greater than 0.02%, is arranged between a group IV semiconductor substrate and the epitaxial group III nitride layer.

2. A multilayer structure with an epitaxial group III nitride layer on either a (001) surface of a group IV semiconductor or a surface of the group IV semiconductor which has a misorientation of less than 8 degrees relative to a (001) orientation, the group III nitride layer being deposited on the surface of the group IV semiconductor with a surface reconstruction in which surface atoms of the group IV semiconductor are arranged in two mutually perpendicular crystallographic directions parallel to the surface at different distances from one another, with either an SOI substrate or an SIMOX substrate, the silicon layer of which forms a strained (001) surface layer.

3. A multilayer structure with an epitaxial group III nitride layer on either a (001) surface of a group IV semiconductor or a surface of the group IV semiconductor which has a misorientation of less than 8 degrees relative to a (001) orientation. the group III nitride layer being deposited on the surface of the group IV semiconductor with a surface reconstruction in which surface atoms of the group IV semiconductor are arranged in two mutually perpendicular crystallographic directions parallel to the surface at different distances from one another, and in which the surface of the group IV semiconductor comprises stripe-shaped trench structures or ridge structures in a <110>direction consisting of a small number of $Si_{1-x-y}Ge_xC_y$ atomic layers.

4. The multilayer structure as claimed in claim 3, in which the trenches extend by between 500 nm and 1 mm in one of the two crystallographic directions parallel to the surface and have a periodicity of between 500 nm and 2 mm.

5. A multilayer structure with an epitaxial group III nitride layer on either a (001) surface of a group IV semiconductor or a surface of the group IV semiconductor which has a misorientation of less than 8 degrees relative to a (001) orientation,
   an epitaxial group III nitride layer being deposited on the surface of the group IV semiconductor, which epitaxial group III nitride layer comprises crystallites of a first and a second type with respective different interatomic distances in two respective mutually perpendicular crystallographic directions parallel to the surface,
   the crystallites of the two types differing from one another in that the respective smaller interatomic distance occurs in mutually perpendicular crystallographic directions relative to the surface of the group IV semiconductor, and
   the crystallites of a first one of the two types occurring in the group III nitride layer only up to a certain distance from the surface of the group IV semiconductor, and there with a lesser frequency than the crystallites of the second type, in which a group IV semiconductor layer of the type $Si_{1-x-y}Ge_xC_y$, with $x+y<1$ and a strain relative to the group IV semiconductor substrate of an amount greater than 0.02%, is arranged between a group IV semiconductor substrate and the epitaxial group III nitride layer.

6. A multilayer structure with an epitaxial group III nitride layer on either a (001) surface of a group IV semiconductor or a surface of the group IV semiconductor which has a misorientation of less than 8 degrees relative to a (001orientation,
an epitaxial group III nitride layer being deposited on the surface of the group IV semiconductor, which epitaxial group III nitride layer comprises crystallites of a first and a second type with respective different interatomic distances in two respective mutually perpendicular crystallographic directions parallel to the surface,
the crystallites of the two types differing from one another in that the respective smaller interatomic distance occurs in mutually perpendicular crystallographic directions relative to the surface of the group IV semiconductor,
the crystallites of a first one of the two types occurring in the group III nitride layer only up to a certain distance from the surface of the group IV semiconductor, and there with a lesser frequency than the crystallites of the second type, and
with either an SOI substrate or an SIMOX substrate, the silicon layer of which forms a strained (001) surface layer.

7. A multilayer structure with an epitaxial group III nitride layer on either a (001) surface of a group IV semiconductor or a surface of the group IV semiconductor which has a misorientation of less than 8 degrees relative to a (001) orientation.
an epitaxial group III nitride layer being deposited on the surface of the group IV semiconductor, which epitaxial group III nitride layer comprises crystallites of a first and a second type with respective different interatomic distances in two respective mutually perpendicular crystallographic directions parallel to the surface,
the crystallites of the two types differing from one another in that the respective smaller interatomic distance occurs in mutually perpendicular crystallographic directions relative to the surface of the group IV semiconductor, and
the crystallites of a first one of the two types occurring in the group III nitride layer only up to a certain distance from the surface of the group IV semiconductor, and there with a lesser frequency than the crystallites of the second type,
in which the surface of the group IV semiconductor comprises stripe-shaped trench structures or ridge structures oriented in a <110>direction and consisting of a small number of $Si_{1-x-y}Ge_xC_y$ atomic layers.

8. The multilayer structure as claimed in claim 7, in which the trenches extend by between 500 nm and 1 mm in one of the two crystallographic directions parallel to the surface and have a periodicity of between 500 nm and 2 mm.

9. A semiconductor component having a multilayer structure with an epitaxial group III nitride layer on either a (001) surface of a group IV semiconductor or a surface of the group IV semiconductor which has a misorientation of less than 8 degrees relative to a (001) orientation, the group III nitride layer being deposited on the surface of the group IV semiconductor with a surface reconstruction in which surface atoms of the group IV semiconductor are arranged in two mutually perpendicular crystallographic directions parallel to the surface at different distances from one another, the semiconductor component containing in an integrated circuit, at least one first component with a multilayer structure with an epitaxial group III nitride layer on either a (001) surface of a group IV semiconductor or a surface of the group IV semiconductor which has a misorientation of less than 8 degrees relative to a (001) orientation, the group III nitride layer being deposited on the surface of the group IV semiconductor with a surface reconstruction in which surface atoms of the group IV semiconductor are arranged in two mutually perpendicular crystallographic directions parallel to the surface at different distances from one another, and at least one second component, which does not contain a group III nitride layer.

10. A substrate with either a (001) surface of a group IV semiconductor or a surface of the group IV semiconductor which has a misorientation of less than 8 degrees relative to a (001) orientation, the surface of the group IV semiconductor having a surface reconstruction in which atoms of the group IV semiconductor are arranged in two mutually perpendicular crystallographic directions parallel to the surface at different distances from one another, and the surface of the group IV semiconductor having stripe-shaped trench structures or ridge structures oriented in a <110>direction and consisting of a small number of $Si_{1-x-y}Ge_xC_y$ atomic layers.

11. The substrate as claimed in claim 10, in which trenches extend by between 500 nm and 1 mm in one of the two crystallographic directions parallel to the surface and have a periodicity of between 500 nm and 2 mm.

12. The substrate as claimed in claim 10, in which the lateral spacing of the stripe-shaped trench or ridge structures from one another amounts to between 40 and 60 nm.

13. The substrate as claimed in claim 12, in which the stripe-shaped trench or ridge structures have a depth or height respectively of between 0.5-5 nm relative to the surface of the group IV semiconductor.

14. The substrate as claimed in claim 12, in which the stripe-shaped trench or ridge structures extend laterally respectively by between 0.5 and 10 nm.

* * * * *

UNITED STATES PATENT AND TRADEMARK OFFICE
CERTIFICATE OF CORRECTION

| | | |
|---|---|---|
| PATENT NO. | : 7,935,987 B2 | Page 1 of 1 |
| APPLICATION NO. | : 11/998464 | |
| DATED | : May 3, 2011 | |
| INVENTOR(S) | : Fabian Schulze et al. | |

It is certified that error appears in the above-identified patent and that said Letters Patent is hereby corrected as shown below:

In column 11, line 9, which is claim 6, line 48, "(001" should be --(001)--.

Signed and Sealed this
Nineteenth Day of July, 2011

David J. Kappos
*Director of the United States Patent and Trademark Office*